United States Patent
Albo et al.

(10) Patent No.: US 9,450,001 B2
(45) Date of Patent: Sep. 20, 2016

(54) METHOD AND SYSTEM FOR DETECTING LIGHT AND DESIGNING A LIGHT DETECTOR

(75) Inventors: Asaf Albo, Haifa (IL); Gad Bahir, Haifa (IL); Dan Fekete, Zikhron-Yaakov (IL)

(73) Assignee: Technion Research & Development Foundation Limited, Haifa (IL)

( * ) Notice: Subject to any disclaimer, the term of this patent is extended or adjusted under 35 U.S.C. 154(b) by 737 days.

(21) Appl. No.: 12/859,299

(22) Filed: Aug. 19, 2010

(65) Prior Publication Data

US 2011/0133088 A1   Jun. 9, 2011

Related U.S. Application Data

(60) Provisional application No. 61/266,216, filed on Dec. 3, 2009.

(51) Int. Cl.

| | | |
|---|---|---|
| *C12Q 1/68* | (2006.01) | |
| *H01L 27/144* | (2006.01) | |
| *B82Y 20/00* | (2011.01) | |
| *G01J 1/44* | (2006.01) | |
| *H01L 31/0352* | (2006.01) | |
| *H01L 31/101* | (2006.01) | |

(52) U.S. Cl.
CPC .......... *H01L 27/1446* (2013.01); *B82Y 20/00* (2013.01); *G01J 1/44* (2013.01); *H01L 31/035236* (2013.01); *H01L 31/101* (2013.01)

(58) Field of Classification Search
CPC .............. G01J 5/20; G01J 5/08; G01J 1/42; H01L 27/14649; G11B 7/00; B82Y 20/00
USPC ............................................. 250/200, 338.4
See application file for complete search history.

(56) References Cited

U.S. PATENT DOCUMENTS

| | | | | |
|---|---|---|---|---|
| 5,077,593 A | * | 12/1991 | Sato | H01L 31/035236 257/189 |
| 5,120,664 A | * | 6/1992 | Murotani | 438/71 |
| 5,311,009 A | * | 5/1994 | Capasso et al. | 250/214 LS |
| 5,943,359 A | * | 8/1999 | Ramdani et al. | 372/96 |
| 5,956,363 A | * | 9/1999 | Lebby et al. | 372/46.013 |
| 2001/0002048 A1 | * | 5/2001 | Koike et al. | 257/80 |
| 2003/0205704 A1 | * | 11/2003 | Gunapala et al. | 257/7 |
| 2005/0202614 A1 | * | 9/2005 | Spruytte et al. | 438/167 |
| 2006/0108528 A1 | * | 5/2006 | Qiu | 250/338.4 |

OTHER PUBLICATIONS

Albo et al. "Polarization-Independent Intersubband Based GaInAsN Quantum-Well Photodetector With Dominat Detection at 1.42 μm", Applied Physics Letters, 94: 093503-1-093593-3, 2009.

Dang et al. "Dilute Nitride Based Double-Barrier Quantum Wells for Intersubband Absorption at 1.31 and 1.55 μm", Physical Review B, 77: 125334-1-125334-12, 2008.

Hakkarainen et al. "Structural and Optical Properties of GaInNAs/GaAs Quantum Structures", Journal of Physics: Condensed Matter, 16: S3009-S3026, 2004.

(Continued)

*Primary Examiner* — Rafferty Kelly

(57) ABSTRACT

A light detection system which comprises an active region between a back contact layer and a front contact layer is disclosed. The active region comprises a quantum well structure having a quantum well between quantum barriers, wherein the quantum well comprises foreign atoms that induce an excited bound state at an energy level which is above an energy level characterizing the quantum barriers.

28 Claims, 8 Drawing Sheets

(56) References Cited

OTHER PUBLICATIONS

Ma et al. "GaInNAs Double-Barrier Quantum Well Infrared Photodetector With the Photodetection at 1.24 μm", Applied Physics Letters, 91: 051102-1-051102-3, 2007.

Ng et al. "Comparison of Electronic Band Structure and Optical Transparency Conditions of InxGa1-xAs1-yNy/GaAs Quantum Wells Calculated by 10-Band, 8-Band, and 6-Band K·P Models", Physical Reviews B, 72: 115341-1-115341-13, 2005.

Perkins et al. "Nitrogen-Activated Transitions, Level Repulsion, and Band Gap Reduction in GaAs1-xNx With x < 0.03", Physical Review Letters, 82(16): 3312-3315, Apr. 19, 1999.

Albo et al. "Unpolarized Intersubband Photocurrent in Te Doped GaInAsN/GaAlAs Quantum Well IR Photodetector", Current Topics in Solid State Physics, 5(6): 2323-2325, 2008.

Ilakkarainen et al. "Structural and Optical Properties of GaInNAs/GaAs Quantum Structures", Journal of Physics: Condensed Matter, 16: S3009-S3026, 2004.

Luna et al. "Dilute Nitride Based Double-Barrier Quantum-Well Infrared Photodetector Operating in the Near Infrared", Applied Physics Letters, 83(15): 3111-3113, Oct. 13, 2003.

Ma et al. "GaInNAs Double-Barrier Quantum Well Infrared Photodetector With the Photodetection at 1.24 μm", Applied Physics Letters, 91: 051102-1-051102-3, 2007.

Ng et al. "Comparison of Electronic Band Structure and Optical Transparency Conditions of InxGa1-xAs1-yNy/GaAs Quantum Wells Calculated by 10-Band, 8-Band, and 6-Band K•P Models", Physical Reviews B, 72: 115341-1-115341-13, 2005.

Hoke et al. "Monolithic Integration of Silicon CMOS and GaN Transistors in a Current Mirror Circuit", Journal of Vacuum Science & Technology B, 30(2): 02B101-1-02B101-6, Dec. 6, 2011.

Kandaswamy et al. "Midinfrared Intersubband Absorption in GaN/AlGaN Superlattices on Si (III) Templates", Applied Physics Letters, 95(14): 141911-1-141911-3, Published Online Oct. 8, 2009.

Pesach et al. "First Demonstration of Plasmonic GaN Quantum Cascade Detectors With Enhanced Efficiency at Normal Incidence", Optics Express, 22(17): 21069-21078, Aug. 22, 2014.

Pesach et al. "Normal-Incident Plasmonic Enhanced GaN/AlN Quantum Cascade Detector", 12th International Conference on Intersubband Transitions in Quantum Wells, ITQW 2013, Lake Gorge, NY, USA, Sep. 16-20, 2013, p. 1-2, 2013.

Pesach et al. "Plasmonic GaN Quantum Cascade SWIR Detector With Enhanced Efficiency at Normal Incidence", International Conference on Optics and Electro-Optics, OASIS 5, Tel-Aviv, Israel, Mar. 3-4, 2015, p. 1-2, Mar. 2015.

Sakr et al. "A Simplified GaN/AlGaN Quantum Cascade Detector With an Alloy Extractor", Applied Physics Letters, 101(25): 251101-1-251101-4, Published Online Dec. 17, 2012.

* cited by examiner

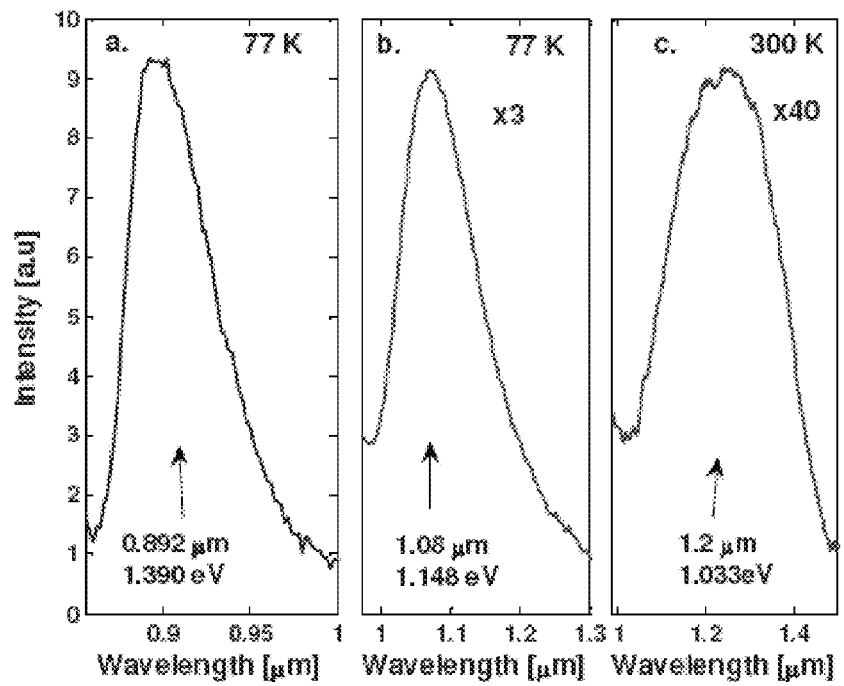
FIG. 8A  FIG. 8B  FIG. 8C
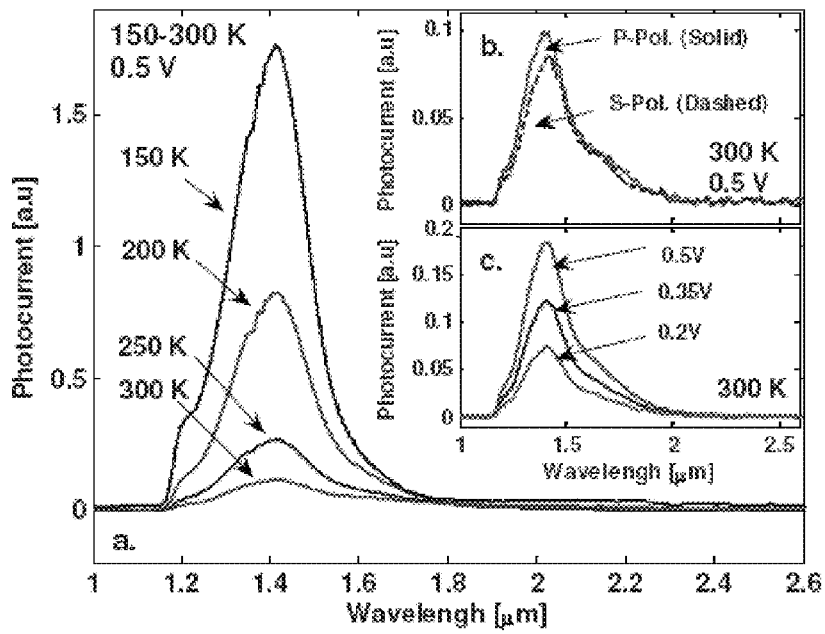
FIGS. 9A-C

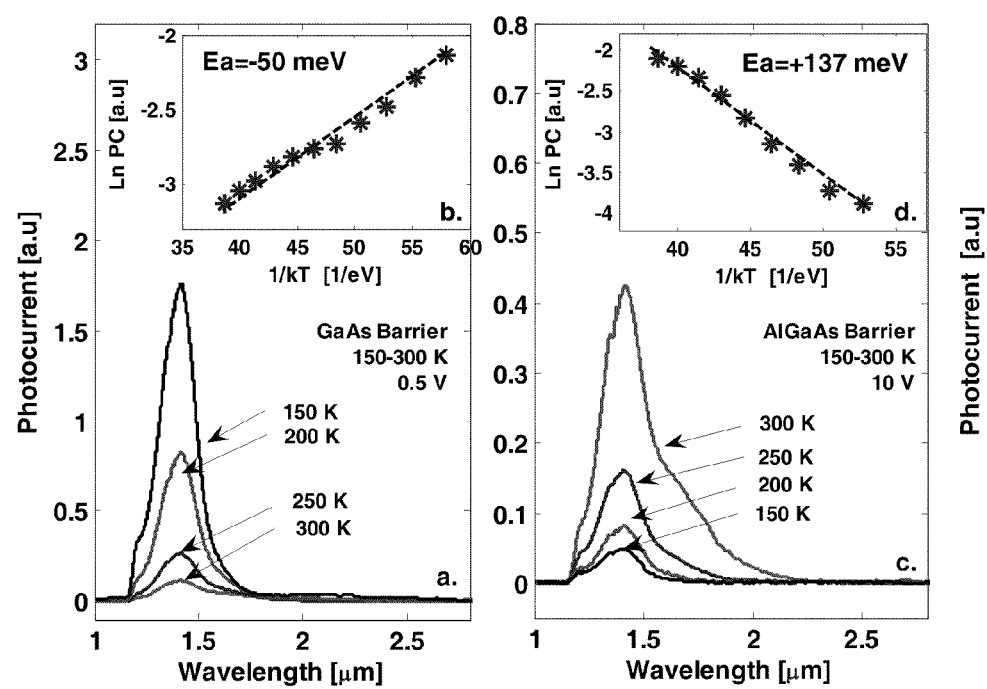
FIGs. 12A-B    FIGs. 12C-D

METHOD AND SYSTEM FOR DETECTING LIGHT AND DESIGNING A LIGHT DETECTOR

RELATED APPLICATION

This application claims the benefit of priority from U.S. Provisional Patent Application No. 61/266,216 filed on Dec. 3, 2009, the contents of which are hereby incorporated by reference as if fully set forth herein.

FIELD AND BACKGROUND OF THE INVENTION

The present invention, in some embodiments thereof, relates to photodetection and, more particularly, but not exclusively, to detection of long wavelength photons.

Recording and measuring a weak signal presents challenging and acute problems for the designers of modern sensors for myriad applications in diverse fields of science and technology. In these sensors, various primary signals (optical, ultrasonic, mechanical, chemical, radiation, etc.) are transformed into elementary charge carriers, such as electrons, holes or ions. Signal charge packets of such elementary charge carriers are amplified and converted to an electrical signal which is fed into a recording or analyzing device and/or used as a feedback signal for monitoring.

One approach to the detection of weak optical signals is the use of photodetectors in which the exposure times are long. These photodetectors typically employ semiconductor technology. Long exposure time photodetectors are suitable for static light source having constant intensity over time (e.g., stars), but are not suitable for rapid imaging applications in which the light has non constant emission intensity and/or originate from moving objects.

Another approach employs avalanche amplification (multiplication) of charge carriers. To date, avalanche amplification is recognized as a highly sensitive and high-speed method of amplification. Avalanche amplification is based on impact ionization arising in a strong electric field. The charge carriers accelerate in the electric field and ionize the atoms of the working medium of the amplifier, resulting in multiplication of the charge carriers. At a high multiplication factor, however, it is difficult to stabilize the avalanche amplification operating point. Additionally, the internal noise level and the response time grow rapidly with the multiplication factor.

Since the energy of photon is inversely proportional to its wavelength the detection of long wavelength single photons, particularly in the infrared (IR) range, is more difficult.

IR detectors can be categorized according to the transport direction, the type of optical transitions, and the type of detection mechanism which can be photovoltaic or photoconductive. Broadly speaking, in response to light impinging on the detector, a photovoltaic detectors generates a measurable voltage (and current), while a photoconductive detector changes its conductance (or resistance).

Currently, prevalent infrared photodetection technology is based on interband (IB) absorption, wherein IB transitions occur in narrow bandgap semiconductors such as HeCdTe, InSb and InGaAs, mostly in PIN configuration. The PIN configuration is typically used in fast detection application. For imaging, the typical configuration is pn junction in case of photo-voltaic devices, and p or n resistor in case of photoconductor. Another technology is based on intersubband (ISB) transitions in heterostructures in a configuration known as Quantum Well Infrared Photodetectors (QWIP), wherein the photodetection mechanism is via absorption between subbands rather than between the valence and conduction bands. An additional technology is based on type-II superlattice structures engineered by deposition of a stack of successive semiconductor layers.

For detection of wavelengths longer from 2 microns, cryogenic temperatures (typically from 77K to 200K) or low temperatures (typically from 200K to 280K) are required for all type of quantum detectors (IB, ISB and superlattice) due to S/N considerations. In general IB detectors can work at higher temperature than ISB detectors.

SUMMARY OF THE INVENTION

According to an aspect of some embodiments of the present invention there is provided a light detection system. The system comprises an active region between a back contact layer and a front contact layer. The active region comprises a quantum well structure having a quantum well between quantum barriers. The quantum well comprises foreign atoms inducing an excited bound state at an energy level which is above an energy level characterizing the quantum barriers.

According to some embodiments of the invention the active region comprises a plurality of similar quantum well structures.

According to some embodiments of the invention the foreign atom comprises nitrogen.

According to some embodiments of the invention the foreign atom comprises bismuth.

According to some embodiments of the invention the thickness of the quantum well is less than 3 nanometers. According to some embodiments of the invention a thickness of the quantum well is from about 2 nanometers to about 3 nanometers.

According to some embodiments of the invention the foreign atoms induce a fundamental bound state at an energy level which is below the energy level characterizing the quantum barriers, wherein an energy difference between the excited bound state and the fundamental bound state is equivalent to a photon wavelength of from about 1 micron to about 10 microns.

According to some embodiments of the invention the quantum well is a GaInAs quantum well, the foreign atoms are nitrogen atoms and the quantum barriers are selected from the group consisting of AlGaAs quantum barriers and GaAs barriers.

According to some embodiments of the invention the quantum well is a GaAs quantum well, the foreign atoms are nitrogen atoms, and the quantum barriers are selected from the group consisting of GaAs quantum barriers and AlGaAs quantum barriers.

According to some embodiments of the invention a thickness of the quantum well is less than 8 nanometers.

According to some embodiments of the invention the quantum well is an InGaAs quantum well, the foreign atoms are nitrogen atoms and the quantum barriers are InP quantum barriers.

According to some embodiments of the invention the quantum well is a GaInAs quantum well, the foreign atoms are nitrogen atoms and the quantum barriers are AlInAs quantum barriers.

According to some embodiments of the invention the quantum well is an InP quantum well, the foreign atoms are nitrogen atoms and the quantum barriers are AlInAs quantum barriers.

According to some embodiments of the invention the quantum well comprises indium at a concentration of from about 20% to about 30%, and wherein the foreign atoms are nitrogen atoms at a concentration of from about 2% to about 4%.

According to some embodiments of the invention the quantum barriers comprise aluminum at a concentration of from about 25% to about 30%.

According to some embodiments of the invention the quantum barriers comprise aluminum at a concentration of less than 15%.

According to some embodiments of the invention the quantum well comprises indium at a concentration of from about 15% to about 25%, wherein the foreign atoms are nitrogen atoms at a concentration of from about 1% to about 2%, and wherein the quantum barriers are devoid of aluminum or comprise aluminum at a concentration of less than 1%.

According to some embodiments of the invention the quantum well is devoid of indium or comprises indium at a concentration of less than 1%, wherein the foreign atoms are nitrogen atoms at a concentration of from about 0.1% to about 0.5%, and wherein the quantum barriers are devoid of aluminum or comprise aluminum at a concentration of less than 1%.

According to an aspect of some embodiments of the present invention there is provided an imaging system. The imaging system comprises the light detection system as described above or exemplified below.

According to an aspect of some embodiments of the present invention there is provided an optical communications system, comprises the light detection system as described above or exemplified below.

According to an aspect of some embodiments of the present invention there is provided a method of detecting light. The method comprises causing the light to impinge on an optically active region of a light detection system, and measuring a change of electrical current generated by the system thereby detecting the light. The active region of the system comprises a quantum well structure having a quantum well between quantum barriers, wherein the quantum well comprises foreign atoms effecting an excited bound state at an energy level which is above an energy level characterizing the quantum barriers.

According to some embodiments of the invention the light is an infrared light.

According to some embodiments of the invention the light is other than a linearly polarized light while impinging on the optically active region.

According to an aspect of some embodiments of the present invention there is provided a method of designing an optically active region of a light detection system. The method comprises: selecting an energy level of a fundamental bound state; selecting an energy difference between an excited bound state and the fundamental bound state; calculating a thickness of a quantum well based on the energy level; and calculating a concentration of foreign atoms in the quantum well based on the energy difference.

According to some embodiments of the invention the method further comprises designing quantum barriers characterized by an energy level which is below an energy level of the excited bound state.

According to some embodiments of the invention the foreign atoms comprise nitrogen atoms.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 8A-C show results of photoluminescence measurements for 25 Å quantum wells fabricated according to some embodiments of the present invention;

FIGS. 9A-C show photocurrent spectral responses of the a light detection system fabricated according to some embodiments of the present invention;

FIGS. 12A-D show photocurrent spectral response of a light detection system fabricated according to some embodiments of the present invention under biases of 0.5 V (FIGS. 12A-B) and 10 V (FIGS. 12C-D).

DESCRIPTION OF SPECIFIC EMBODIMENTS OF THE INVENTION

The present invention, in some embodiments thereof, relates to photodetection and, more particularly, but not exclusively, to detection of long wavelength photons.

Figure 1:
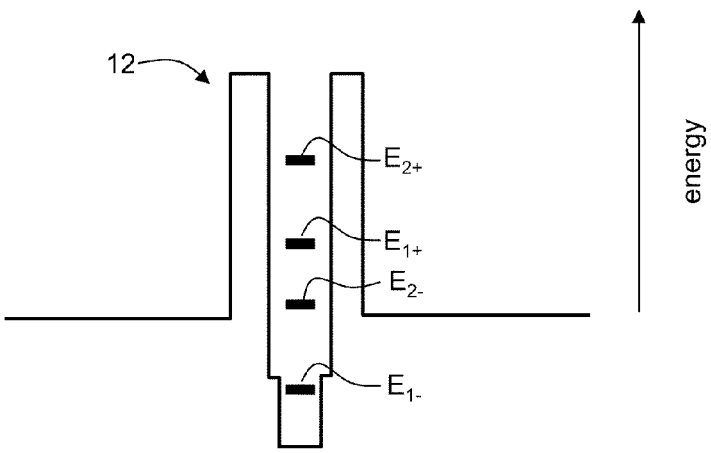
FIG. 1 is a schematic illustration of the energy levels in a configuration known as double-barrier quantum well (DBQW) infrared detector.

For purposes of better understanding some embodiments of the present invention, as illustrated in FIGS. 2-14 of the drawings, reference is first made to the construction and operation of a light detection system as illustrated in FIG. 1.

FIG. 1 is a schematic illustration of the energy levels in a configuration known as double-barrier quantum well (DBQW), see, e.g., Dang et al., 2008, Physical Review B 77, 125334. The DBQW is made of a dilute nitride based material system wherein the quantum well (QW) includes nitrogen atoms at low concentration that modify the energy levels of the system. This structure includes two thin layers with an extremely large band gap and a layer with a smaller band gap which form a combined barrier, generally shown at 12. FIG. 1 corresponds to a DBQW in which the QW is made of a GaAsN compound and the barriers are made of an AlAs (inner barrier) and AlGaAs (outer barrier) compounds. As shown in FIG. 1 the DBQW is characterized by a very deep well. The nitrogen level is introduced between the ground level $E_1$ and the first excited level $E_1$ in the conduction band of the GaAsN/AlAs structure, leading to the splitting of each of these levels as follows. The ground state $E_1$ splits into two levels, denoted in FIG. 1 by $E_{1-}$ and the first excited state $E_2$ splits into two levels, denoted in FIG. 1 by $E_{2-}$ and $E_{2+}$ ($E_{1-}<E_{2-}<E_{1+}<E_{2+}$).

In order to exploit the splitting of the levels for subband transitions, the barrier is designed to be characterized by an energy level which is higher than $E_{2+}$, such as to confine all the states with the well. This allows for transitions from the $E_{1-}$ state to the $E_{2-}$ state (corresponding to absorption at energy of 276 meV), and from the $E_{1-}$ state to the $E_{2+}$ state (corresponding to absorption at energy of 730 meV), with a higher absorption peak for the latter.

The present inventors discovered a different technique for exploiting the energy levels generated by the inclusion of foreign atoms in the QW.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 2A:
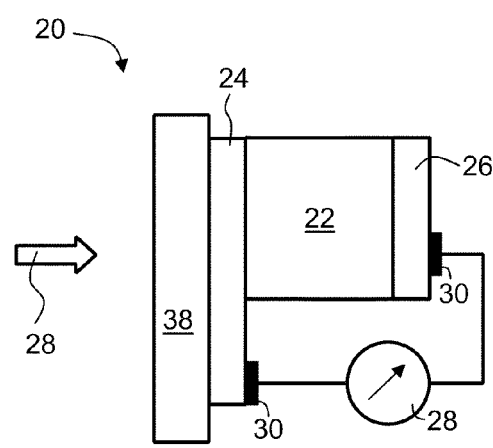
FIGS. 2A-C are schematic illustrations of a light detection system 20, according to various exemplary embodiments of the present invention.
Figure 2B:
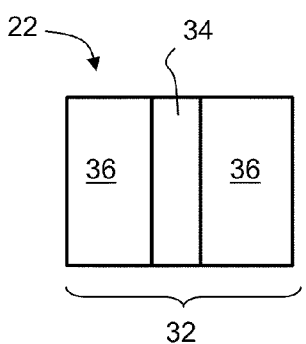
Figure 2C:
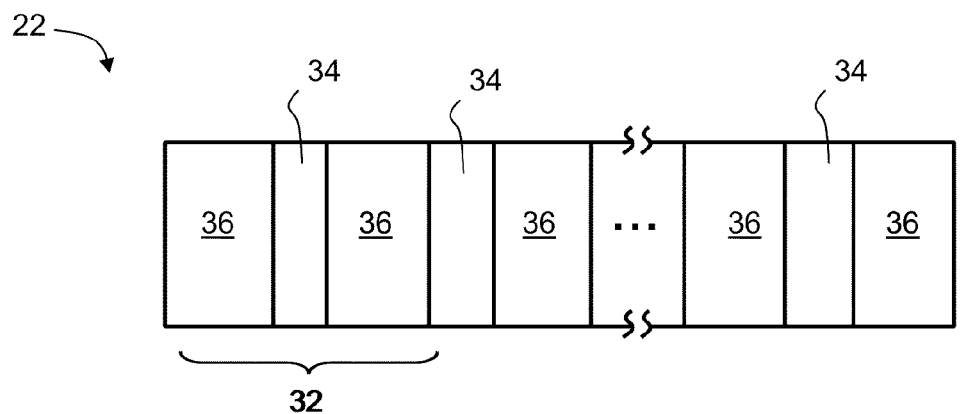

FIGS. 2A-C are schematic illustrations of a light detection system 20, according to various exemplary embodiments of the present invention. System 20 comprises an active region 22 between a back contact layer 24 and a front contact layer 26. Typically, layer 24, region 22 and layer 26 are serially deposited on a carrier substrate 38. In the schematic illustration of FIG. 2A back contact layer 24 is next to substrate 38, but this need not necessarily be the case, since, for some applications, it may be desired to have substrate 38 at the opposite side, namely next to front contact layer 26.

Back contact layer 24 can be made of a material which is transmissive to the wavelength of light 28. In embodiments in which layer 24 is next to substrate 38, is substrate 38 is also made of a material which is transmissive to the wavelength of light 28.

In use, light 28 impinges on layer 24 (e.g., through substrate 38) propagate through layer 24 and is absorbed by a quantum well 34 within active region 22. As a result, charge carriers in region 22 are excited and a potential difference is generated between layers 24 and 26 due to external bias. When layers 24 and 26 are connected to a measuring device 28, for example, using metal contacts 30, the potential difference results in electrical current through device 28 which measures the current (or a proxy thereof), thereby generating a light detection event.

Active region 22 is illustrated in more details in FIGS. 2B-C. In various exemplary embodiments of the invention region 22 comprises a quantum well structure 32 having a quantum well 34 between quantum barriers 36.

A quantum well, as used herein, is a semiconductor crystalline structure with size dependent optical and electrical properties. Specifically, a quantum well exhibits quantum confinement effects such that there is a one-dimensional confinement of electron-hole bound pairs or free electrons and holes. The semiconductor structure can have any shape.

A quantum well is typically embodied as a thin layer of a semiconductor compound, where the one-dimensional quantum confinement is along the thickness direction of the layer. The thickness of such layer is typically, but not necessarily, less than about 10 nanometers, e.g., from about 1 nanometer to about 10 nanometers.

A quantum barrier, as used herein refers to a semiconductor crystalline structure that is next to a quantum well and that creates an energy barrier which imposes confinement and restriction on motion of charge carriers out of the quantum well. Specifically, a quantum barrier is characterized by an energy level. Charge carriers can migrate into the barrier continuum if they are excited to an energy level which is higher than the energy level of the barrier or via quantum tunneling.

Typically, quantum barrier is embodied as a layer of a semiconductor compound, where the relative concentration of the elements forming the compound. The thickness of the quantum barrier layer is larger than that of the adjacent quantum well. The thickness of a quantum barrier is generally determined from dark current reduction consideration, e.g., reduction of dark current caused by tunneling between fundamental bound states of adjacent well, and reduction of dark current caused by defects. Such considerations are well known to those skilled in the art of quantum well structures.

Typical thickness of a quantum barrier layer suitable for the present embodiments is several tens of nanometers, e.g., from about 20 nanometers to about 80 nanometers.

Figure 3:
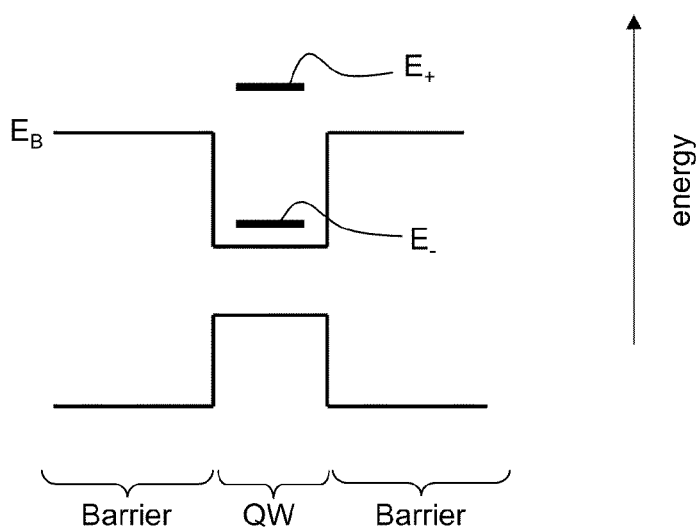
FIG. 3 is an energy diagram illustrating energy levels in a quantum well structure according to various exemplary embodiments of the present invention.

In various exemplary embodiments of the invention the quantum well comprises foreign atoms which induce an excited bound state at an energy level which is above the energy level characterizing the quantum barriers. This is illustrated in an energy diagram shown in FIG. 3. The energy level of the quantum barriers is denoted $E_B$. As a result of the foreign atoms in the QW, there is an excited quasi-bound state characterized an energy value denoted $E_+$, and a fundamental state characterized an energy value denoted $E_-$. However, unlike the configuration in FIG. 1, the quantum well structure of the present embodiments has at least one excited bound state above the barrier and at least one bound state below barrier. In the schematic illustration of FIG. 3, this corresponds to $E_+ > E_B$ and $E_- < E_B$. It is to be understood that although FIG. 3 shows a single bound state below $E_B$ and a single bound state above $E_B$, this need not necessarily be the case, since there can be more than one bound state below and/or above $E_B$. A situation in which there are two bound states below the level (denoted $E_{1-}$ and $E_{2-}$) of the barrier is demonstrated in the Examples section that follows.

Without wishing to be bound by any theory, the present inventors consider the state $E_+$ as a bound state in the continuum (BSIC). BSIC is a spatially confined state that is embedded in the higher-energy continuum states. The concept of BSIC was proposed by Wigner and von Neumann shortly after the birth of quantum mechanics (for review see, e.g., N. Moiseyev, 2009, Phys. Rev. Lett. 102, 167404; Friedrich et al., 1985, Phys. Rev. A 32, 3231; Okolowicz et al., 2003, Phys. Rep. 374, 271; D. R. Herrick, 1977, Physica B 85, 44; F. H. Stillinger, 1977, Physica B 85, 270; Capasso et al., 1992, Nature (London) 358, 565; Salzman et al., 1991, Appl. Phys. Lett. 59, 1858; and Bastard et al., 1984, Solid State Com. 49, 671). The Examples section that follows provides experimental indication that the $E_+$ state is a BSIC.

The term "foreign atoms," as used herein, refers to atoms other than the atoms forming the semiconductor compound that forms the quantum well, and other than donor atoms of a doping agent (such as atoms of Te, Sn and Si) that is inserted into the semiconductor compound.

The foreign atoms can be of any known type provided they induce the excited bound state above the quantum well barrier's energy level. Representative examples of such atoms including, without limitation, nitrogen atoms and bismuth atoms.

When light 28 is absorbed by the active region 22 an electron in a bound state below the barrier's energy level (e.g., an electron in the ground state) is excited to the bound state above the barrier's energy level. Thus, the difference between the energy levels of the $E_+$ state and the $E_-$ state preferably corresponds to the wavelength of the light that system 20 detects. Preferably, the difference between the energy levels corresponds to a photon wavelength of from about 1 micron to about 10 microns, e.g., from about 1 micron to about 2 microns, or from about 2 micron to about 3 microns, or from about 3 micron to about 4 microns, or from about 4 micron to about 5 microns. Higher wavelengths are not excluded from the scope of the present invention.

Referring to FIG. 2C, active region 22 can comprise a plurality of quantum well structures, e.g., at least 10 or at least 20 or at least 30 or at least 40, or at least 50 quantum well structures. The quantum well structures are arranged as alternating layers such that each quantum well is between two quantum barriers.

It was conceived and demonstrated by the present inventors that system 20 can be used for detecting infrared light. It was further demonstrated by the present inventors that system 20 can be used for detecting light even when the light is not linearly polarized light while impinging on the optically active region of system 20.

The concentration of the foreign atoms in the quantum well is typically of a few percents, preferably less than 5%. It is emphasized that this concentration of the foreign atoms does not includes the concentration of donor atoms (typically from about $10^{17}$ atoms per cubic centimeter to about $10^{18}$ atoms per cubic centimeter) that provide the electrons for light detection.

The quantum well can be made of any type of semiconductor compound that is doped with donor atoms and that is suitable for quantum wells, together with a suitable concentration of the foreign atoms. Representative examples include, without limitation, GaAsR quantum well doped with, e.g., Si or Te, InGaAsR quantum well doped with, e.g., Si or Te or Sn, and InPR quantum well doped with, e.g. Si, where R represents the foreign atoms (e.g., R=N or R=Bi). The semiconductor compound for the quantum barriers is preferably selected to be compatible with the compound of the quantum well, as known in the art. For example, when a GaAsR quantum well is employed, the quantum barriers are preferably made of GaAs or AlGaAs; when an InGaAsR quantum well is employed, the quantum barriers are preferably made of InP or AlInAs or AlGaAs or GaAs; when an InPR quantum well is employed, the quantum barriers are preferably made of AlInAs.

In some embodiments, the thickness of the quantum well is less than 3 nanometers, e.g., from about 1 nanometer to about 3 nanometers or from about 2 nanometers to about 3 nanometers. These embodiments are particularly useful when the quantum well is a GaInAs quantum well, the foreign atoms are nitrogen atoms, and the quantum barriers are AlGaAs, GaAs, InP or InAlAs quantum barriers.

In some embodiments, the thickness of the quantum well is less than 3 nanometers, e.g., from about 1 nanometer to about 8 nanometers or from about 2 nanometers to about 8 nanometers. These embodiments are particularly useful when the quantum well is a GaAs quantum well, the foreign atoms are nitrogen atoms, and the quantum barriers are GaAs or AlGaAs quantum barriers. Such active region can be configured (e.g., by judicious selection of the quantum well thickness, the Al concentration which sets the barrier height, and the concentration of the foreign atoms), for detection of photons at a wavelength of from about 1.5 micron to about 20 microns.

Following are several examples of combinations of materials and other parameters, which are not to be considered as limiting.

In some embodiments of the present invention the thickness of the quantum well is from about 2 nanometers to about 3 nanometers, the quantum well comprises indium at a concentration of from about 20% to about 30%, the quantum barriers comprise aluminum at a concentration of from about 25% to about 30%, and the foreign atoms are nitrogen atoms at a concentration of from about 2% to about 4%. These embodiments are particularly useful for a light detection system that detects light at a wavelength of from about 1 μm to about 2 μm. The present inventors found that such system can have a responsivity of about 20 A/W, a gain which is higher than 1000 and a dark current of about $2\times10^{-8}$ A/cm$^2$ at a voltage of 0.2 V and a temperature of about 300K. The present inventors also found that for such system, the typical normalized detectivity D* is $5.6\times10^{12}$ cm(Hz)$^{0.5}$/W.

In some embodiments of the present invention the thickness of the quantum well is from about 2 nanometers to about 3 nanometers, the quantum well comprises indium at a concentration of from about 20% to about 30%, the quantum barriers are devoid of aluminum or comprise aluminum at a concentration of less than 15%, and the foreign atoms are nitrogen atoms at a concentration of from about 2% to about 4%. These embodiments are particularly useful for a light detection system that detects light at a wavelength of from about 2 μm to about 3 μm. The present inventors found that such system can have a responsivity of about 20 A/W, a gain which is higher than 1000 and a dark current of about $1\times10^{-5}$ A/cm$^2$ at a voltage of 0.2 V and a temperature of about 225K. The present inventors also found that for such system, the typical normalized detectivity D* is $2.5\times10^{11}$ cm(Hz)$^{0.5}$/W.

In some embodiments of the present invention the thickness of the quantum well is from about 2 nanometers to about 3 nanometers, the quantum well comprises indium at a concentration of from about 15% to about 25%, the quantum barriers are devoid of aluminum or comprise aluminum at a concentration of less than 1%, and the foreign atoms are nitrogen atoms at a concentration of from about 1% to about 2%. These embodiments are particularly useful for a light detection system that detects light at a wavelength of from about 4 μm to about 5 μm. The present inventors found that such system can have a responsivity of about 20 A/W, a gain which is higher than 1000 and a dark current of about $1\times10^{-5}$ A/cm$^2$ at a voltage of 0.2 V and a temperature of about 130K. The present inventors also found that for such system, the typical normalized detectivity D* is $2.5\times10^{11}$ cm(Hz)$^{0.5}$/W.

In some embodiments of the present invention the thickness of the quantum well is from about 2 nanometers to about 3 nanometers, the quantum well is devoid of indium or comprises indium at a concentration of less than 1%, the quantum barriers are devoid of aluminum or comprise aluminum at a concentration of less than 1%, and the foreign atoms are nitrogen atoms at a concentration of less than 0.5%. These embodiments are particularly useful for a light detection system that detects light at a wavelength of from about 8 μm to about 10 μm. The present inventors found that such system can have a responsivity of about 20 A/W, a gain which is higher than 1000 and a dark current of about $4\times10^{-4}$ A/cm$^2$ at a voltage of 0.2 V and a temperature of about 77K. The present inventors also found that for such system, the typical normalized detectivity D* is $4\times10^{10}$ cm(Hz)$^{0.5}$/W.

Figure 4:
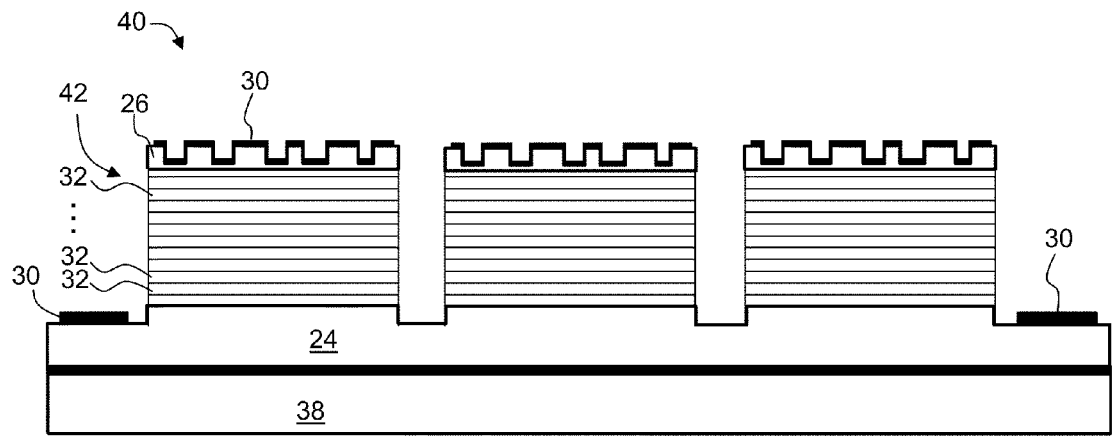
FIG. 4 is a schematic illustration of a light detection system which comprises a plurality of light detecting units, according to various exemplary embodiments of the present invention.

FIG. 4 is a schematic illustration of a light detection system 40 which comprises a plurality of light detecting units 42. System 40 comprises a carrier substrate, such as substrate 38, and a back contact layer, such as layer 24, deposited on substrate 38. A two-dimensional array of light detecting units 42 is arranged on layer 24. Each of light detecting units 42 can be similar to system 20. Specifically, unit 42 preferably comprises a stack of quantum well structures, such as quantum well structures 32 described above. Unit 42 further comprises a front contact layer, such as layer 26. Layer 26 can be in the form of a grating, which is constituted to reflect photons that failed to be absorbed by the quantum wells.

The lateral dimensions of unit 42 (parallel to substrate 38) is typically about 20×20 μm$^2$, and the thickness of unit 42 (perpendicular to substrate 38) is typically several microns, depending on the number of quantum well structures in the stack. System 40 typically comprises about 100×500 light detecting units 42 arranged in a two-dimensional array.

Systems 20 and 40 can be manufactured using chemical vapor deposition CVD, e.g., metal organic CVD (MOCVD), or Molecular Beam Epitaxy (MBE) or metal organic MBE, as known in the art, combined with photolithography and etching techniques which are also known in the art. Metal contacts 30 can be formed by depositing a metallic alloy (e.g., Ni—Ge—Au—N—Au alloy) on the contact layers 24 and 26 as known in the art.

Representative examples of techniques for fabricating quantum wells which comprise nitrogen atoms are described in the Examples section that follows and in U.S. application Ser. No. 12/789,481 the contents of which are hereby incorporated by reference.

Systems 20 and 40 can be employed in many appliances, including, without limitation, an imaging system, and an optical communications system.

Figure 5:
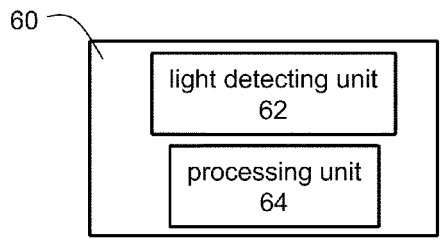
FIG. 5 is a schematic illustration of an imaging system, according to some embodiments of the present invention.

Reference is made to FIG. 5 which is a schematic illustration of an imaging system 60, according to some embodiments of the present invention. System 60 comprises a light detecting unit 62 which generates electrical current in response to light and a processing unit 64 which generates an image based on the generated current. Light detecting unit 62 can comprise one or more systems similar to system 20 or 40. For example, several such systems can be arranged pixelwise. Optionally, system 60 operates in the infrared domain so as to allow, e.g., thermal imaging. The relatively high responsivity of systems 20 and 40 allows for system 60 to be suitable for very low light intensity imaging, in addition to thermal imaging. In particular, but not exclusively, system 60 is suitable for low-light night-imaging at a wavelength of 1-2 μm. In some embodiments of the present invention system 60 provides a single photon imaging. The light for the low light intensity imaging can be reflected or emitted from the objects in the imaged scene.

Figure 6:
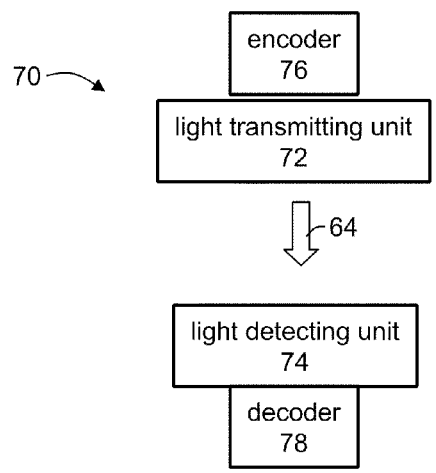
FIG. 6 is a schematic illustration of an optical communications system, according to some embodiments of the present invention.

FIG. 6 is a schematic illustration of an optical communications system 70, according to some embodiments of the present invention. Communications system 70 comprises a light transmitting unit 72 for transmitting light 74 and light detecting unit 76 which generates electrical current in response to light 74. Light detecting unit 62 can comprise one or more systems similar to system 20 or 40. Light transmitting unit 72 can be of any type known in the art. System 70 preferably also comprises an encoder 76 coupled to unit 72 and configured for encoding information into light 74 prior to the transmission, and a decoder 78 which receives electrical current from unit 74, decodes it and outputs the information to an external appliance (not shown). Optionally, system 70 operates in the infrared domain.

Figure 7:
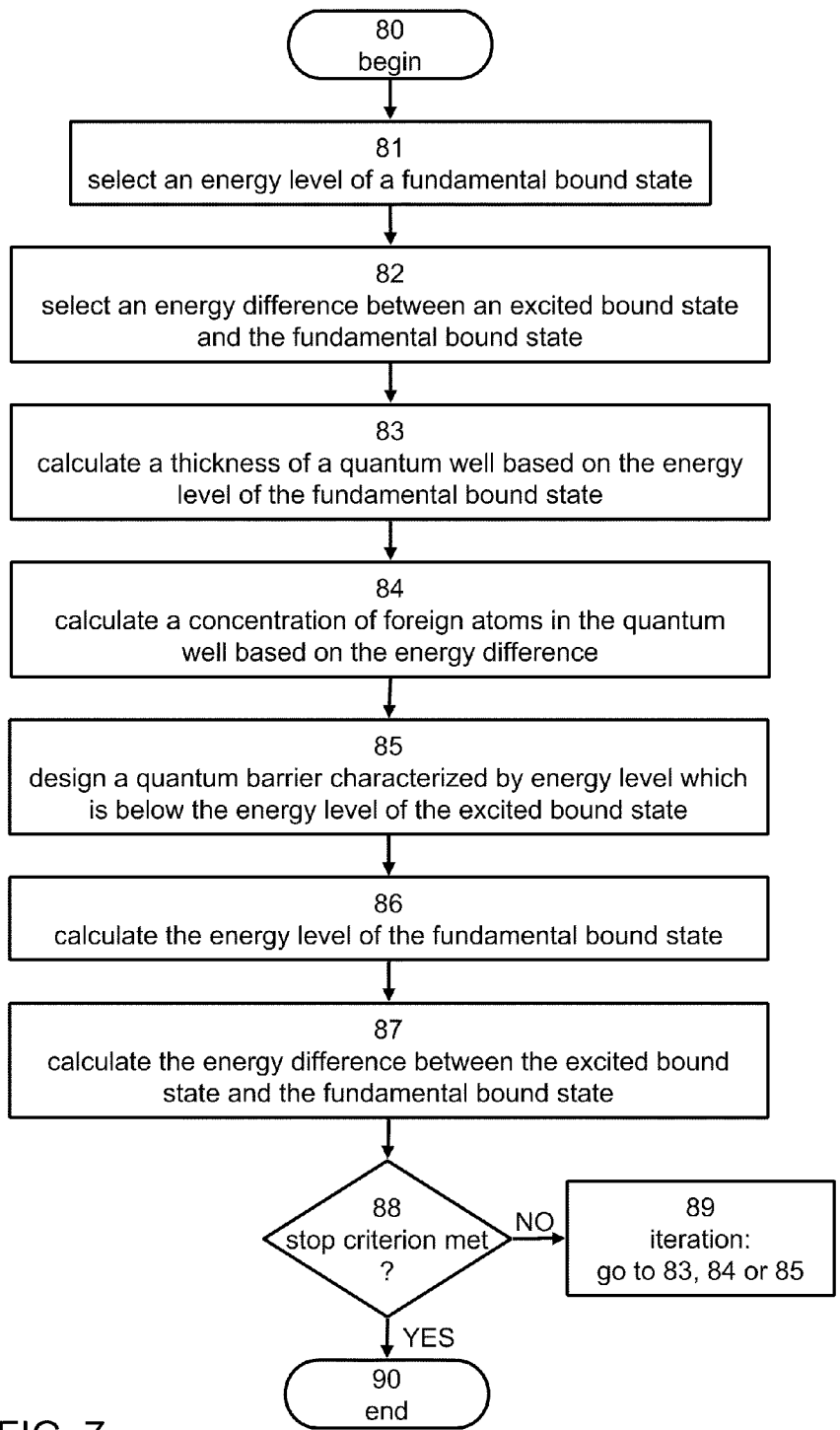
FIG. 7 is a flowchart diagram of a method suitable for designing an optically active region of a light detection system according to some embodiments of the present invention.

FIG. 7 is a flowchart diagram of a method suitable for designing an optically active region of a light detection system according to various exemplary embodiments of the present invention. It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The method can be used for designing optically active region 22 of system 20. The method is suitable for designing the optically active region for a given system of semiconductor elements. For example, when it is desired to fabricate an optically active region of the type GaInAsN/GaAs, where the relative concentrations of Ga, In and As are pre-selected, the method can be used to determine the thickness of the quantum well and the concentration of the nitrogen.

The method begins at 80 and continues to 81 at which an energy level of a fundamental bound state is selected. The selected energy level corresponds to the bound state which is below the quantum barrier's level $E_B$ (see FIG. 3). For example, at 81 the method can select the value of $E_-$. At 82 the method selects an energy difference between an excited bound state and the fundamental bound state. The excited bound state corresponds to the bound state which is above $E_B$. For example, the excited bound state can be a BSIC. In the schematic illustration of FIG. 3, the method selects a value of the difference $E_+ - E_-$. The selected energy difference corresponds to the desired wavelength that will excite an electron from $E_-$ to $E_+$ to produce a photocurrent in the light detection system.

The method proceeds to 83 at which a thickness of a quantum well is calculated based, at least in part, on the value of the selected energy level, and to 84 at which the concentration of the foreign atoms in the quantum well is calculated based, at least in part, on the energy difference.

The method optionally and preferably continues to 85 at which the method designs quantum barriers characterized by an energy level which is below an energy level of the excited bound state.

The calculations at 83 and 84 are preferably executed by a data processor supplemented by a model-based algorithm. In various exemplary embodiments of the invention the ten band k·p model is employed. The ten band k·p model describes the effect of localized foreign atom level coupling to the extended conduction and valence band states, taking the strain into account. Preferably, the algorithm employs a finite elements approach is used. The ten band k·p model is known in the art and is found, e.g., in Fan et al., 2005, Phys. Rev. B 72, 115341; and Dang et al. supra, the contents of which are hereby incorporated by reference.

The method may use for the calculation a predetermined set of parameters. Such parameters may include thresholds values pertaining to the desired performance and operation conditions of the detection system. Representative examples of such thresholds include, without limitation, a minimal responsivity threshold, a minimal gain threshold, a maximal dark current threshold (e.g., dark current of less than 0.5 mA/cm$^2$, or less than 0.1 mA/cm$^2$, or less than 10 µA/cm$^2$, or less than 1 µA/cm$^2$, or less than 20 nA/cm$^2$ or less than 10 nA/cm$^2$), a minimal temperature threshold (e.g., temperature of at least 70K or at least and a minimal normalized detectivity threshold.

A typical value for the responsivity threshold, is about 20 W/A; a typical value for the minimal gain threshold is about 1000; a typical value for the maximal dark current threshold is 0.5 mA/cm$^2$ for a wavelength of 8-10 µm, about 10 µA/cm$^2$ for a wavelength of 2-5 µm, and about 20 nA/cm$^2$ for a wavelength of 1-2 µm; a typical value for the minimal temperature threshold is about 77K for a wavelength of 8-10 µm, about 130K for a wavelength of 4-5 µm, about 225K for a wavelength of 2-3 µm, and about 300K for a wavelength of 1-2 µm; and a typical value for the minimal normalized detectivity threshold is about $4 \times 10^{10}$ cm(Hz)$^{0.5}$/W for a wavelength of 8-10 µm, about $2.5 \times 10^{11}$ cm(Hz)$^{0.5}$/W for a wavelength of 2-5 µm, and about $5.6 \times 10^{12}$ cm(Hz)$^{0.5}$/W for a wavelength of 1-2 µm.

The method optionally and preferably employs a knowledge base system for retrieving other parameters that are required for the calculations and design. For example, the barrier can be designed using experimental data pertaining to other semiconductor devices having the same system of semiconductor materials.

The method can also employ a knowledge base system for retrieving parameters pertaining to the position of the localize states of the foreign atoms, and the interaction strengths of these localize states with the conduction band states and valence band states. Experimental data that can be used as a knowledge base system is found, for example, in Shan et al Phys. Rev. Lett. 82, 1221 (1999); Giehler et al., 2006, Phys. Rev. B 73, 085322; O'Reilly et al., 2002, Semicond. Sci. Technol. 17, 870; Vurgaftman et al., 2001, J. Appl. Phys. 89, 5815; Vurgaftman et al., 2003, J. Appl. Phys. 94, 3675; and Potter et al., 2004, J. Phys.: Condens. Matter 16, S3387, the contents of which are hereby incorporated by reference.

In various exemplary embodiments of the invention the method is executed iteratively. Each iteration stage optionally includes calculation of parameters, such as the energy level of the fundamental bound state, and the energy difference between the excited bound state and the fundamental bound state. This calculation is executed by the data processor for the given set of parameters which were obtained at the previous iteration stage.

For example, the method can optionally calculate 86 the energy level of the fundamental bound state. This energy level can be different from the value selected at 81 since the presence of foreign atoms slightly modifies the energy level of the fundamental bound state. Thus, at 86 the method calculates the energy level as would be modified by the foreign atoms as calculated at 84. Additionally, since the quantum barrier may also modify the fundamental bound state, the method calculates the energy level as would be modified by the quantum barrier as designed at 85.

The method can optionally calculate 87 the energy difference between the excited bound state and the fundamental bound state, as would be modified by the foreign atoms as calculated at 84 and/or the quantum barrier as designed at 85.

The iterative process preferably has a stop criterion, which is typically expressed as a stability threshold. For example, the method can declare that the stop criterion is met when the difference between the values of the parameters, as calculated in two consecutive iteration stages is less than 10% or less than 5%.

Thus, the method optionally proceeds to decision 88 at which the method determines whether or not the stop criterion is met. If the stop criterion is not met, the method loops back, preferably to 83 for executing 83 and optionally also 84 and/or 85. Alternatively, the method can loop back directly to 84 or 85. If the stop criterion is met, the method proceeds to 90 at which the method ends.

Once the calculations are completed, the method issues a report regarding the result of the calculations, particularly the thickness of the well, and the concentration of the foreign atoms and the semiconductor materials. The report can be used as a starting condition for the construction of the active region. The quantum well structure is grown according to the report and is analyzed to determine its compatibility. Such analysis can include photoluminescence, e.g., for measuring the bandgap energy of the grown structure, STEM, e.g., for measuring the well and barrier thicknesses of the grown structure, high resolution x-ray diffraction, e.g., for confirmation of the full structures and data on strain and lattice defects, secondary ion mass spectroscopy (SIMS), e.g., for measuring the make of the semiconductor compounds in each layer, and Hall measurements for measuring, e.g., the electron concentration in the doped QW. The results of the measurements can be used for modifying the calculated parameters and re-growing the structures in an iterative manner.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

Exemplified GaInAsN/GaAs Light Detection System

A light detection system according to some embodiments of the present invention was fabricated. The light detection system successfully detected light at a wavelength of 1.42 μm at room temperature. The system was a QWIP that included a structure of Te-doped GaInAsN/GaAs.

Structures were grown by metal organic chemical vapor deposition on semi-insulating (001)-oriented GaAs substrates. The active region was a ten-period GaInAsN/GaAs Multi-Quantum Well (MQW) structure, which included Te-doped 25 Å $GaIn_{0.25}AsN_{0.02}$ QWs and 480 Å undoped GaAs barriers. The MQW structure was sandwiched between 5000 Å thick highly N-doped GaAs contact layers grown at 650° C. The doped active GaInAsN QWs were grown at 500° C. with nominal doping concentration lower than $5 \times 10^{17}$ $cm^{-3}$, as known in the art (see, e.g., Albo et al., 2008, Phys. Status Solidi C 5, 2323; and Hakkarainen et al., 2004, J. Phys.: Condens. Matter 16, S3009). The undoped GaAs barrier layers were grown at 750° C.

Standard photolithography and wet etching techniques were used to form 200×200 $\mu m^2$ mesa structures. n-type Ohmic contacts were formed by Ni—Ge—Au—N—Au alloy deposited onto the top and bottom contact layers and annealed at 400° C.

High resolution x-ray diffraction (HRXRD), low temperature conducted (PL), secondary ion mass spectroscopy (SIMS), and transmission electron microscopy (TEM) were employed for characterizing the quality of the MQW structures. The HRXRD dynamic rocking curves, obtained by performing (ω-2θ) (004) symmetric reflection scans, showed well-defined periodic satellite peaks indicating good crystal quality.

The thickness and composition of a GaInAsN single QW (SQW) were obtained using the PL spectrum emitted from the QWs. The PL was excited at a wavelength of 632.7 nm of a 10 mW He—Ne laser and detected by a nitrogen cooled Ge photodetector. Once the growth rate and the In content of GaInAs SQWs grown at 500° C. was found, the same growth parameters were used for growing the GaInAsN QW with the addition of nitrogen atoms. The N content was determined from the redshift of the PL peak relative to the peak emitted from GaInAs QWs with the same thickness and indium composition using the calculated shift obtained from a ten band k·p model. This result was verified by SIMS measurements. PL spectra at 77 K of Te-doped 25 Å GaIn$_{0.25}$As and GaIn$_{0.25}$AsN$_{0.02}$ SQWs are shown in FIGS. 8A-B, respectively. Room temperature PL data of the GaIn$_{0.25}$AsN$_{0.02}$ SQW are shown in FIG. 8C, indicating an interband E1_ to HH1 transition of 1.033 eV (1.2 μm) as confirmed by the ten band k·p model. The lower intensity and broader width of the GaInAsN QWs PL peak reflect its lower crystal quality.

In order to study the intersubband (ISB) photocurrent (PC) dependence on light polarization, a 45° wedge was polished on the sample side. The sample was illuminated by infrared light normal to the polished facet. PC was measured in wedge configuration using a Fourier transform infrared (FTIR, Bruker-Equinox 55) spectrometer with internal near-infrared (NIR) and mid-infrared (MIR) sources. For the PC measurements the detector was mounted in a closed cycle helium flow optical cryostat and characterized at a different applied bias voltages and P- and S-radiation polarizations. All measurements were conducted using a 1.18 μm high pass filter to prevent "parasitic" response related to GaAs contact layers and interband PC.

Temperature-dependent photoresponse spectra of the light detection system are shown in FIG. 9A. The bias voltage was fixed at 0.5 V and chopper frequency f at 135 Hz. The dominant PC signal peaks at 1.42 μm with a peak width at half maximum ($\Delta\lambda/\lambda_{peak}$) of 14%. Although signal intensity decreases with increasing temperature, it is still significant at room temperature. The negligible temperature dependence of the peak position is an indication for its ISB nature. It is noted that the PC peak energy is similar to those seen by double barrier configurations (see, e.g., Luna et al., 2003, Appl. Phys. Lett. 83, 3111; ┌ and Ma et al., 2007, Appl. Phys. Lett. 91, 051102). However, unlike these traditional configurations, the barrier of the system of the present embodiments is not high enough to confine the $E_{+2}$ level, as is be demonstrated below.

The observed ISB PC spectra measured in the two wedge polarizations at room temperature are shown in FIG. 9B. As shown, similar intensities both at P and S polarizations were measured. Taking into account that for P polarization both transverse-magnetic (TM) and transverse-electric (TE) polarizations are present, it is concluded that the absorptions of TM and TE polarized light are about the same. The voltage dependence of the PC signal is shown in FIG. 9C. As shown, there is a linear increase in the room temperature signal intensity with the applied voltage. This behavior is characteristic to a phenomenon of electron transition to the quasicontinuum and mobility dependence on bias electric field. Intraband PC responsivity was measured using a calibrated 1.55 μm semiconductor laser in waveguide configuration and a standard lock-in technique. Taking into account the losses of the optical path, size of the detector, and coupling efficiency of the light, the room temperature peak current responsivity of the system was estimated to be about 2 A/W. The system reached maximum responsivity of 22 A/W at 150 K which is considered very high photoresponse for a QWIP technology.

The band structure, wave function, and ISBT energies of symmetric GaInAsN/GaAs QWs were calculated using a ten band k·p model that describes the effect of localized nitrogen level coupling to the extended conduction and valence band states (Fan et al., 2005, Phys. Rev. B 72, 115341). The model takes into account the strain. The binary compounds and the GaInAsN nitrogen parameters (the localized nitrogen-related energy level position, $E_N$, and the interaction strengths of $E_N$ with the conduction band states, $V_{NC}$, and valence band states, $P_N$) were taken from the literature [Giehler et al., 2006, Phys. Rev. B 73, 085322; O'Reilly et al., 2002, Semicond. Sci. Technol. 17, 870; Vurgaftman et al., 2001, J. Appl. Phys. 89, 5815; Vurgaftman et al., 2003, J. Appl. Phys. 94, 3675; and Potter et al., 2004, J. Phys.: Condens. Matter 16, S3387).

Figures 10A, 10B, 10C:
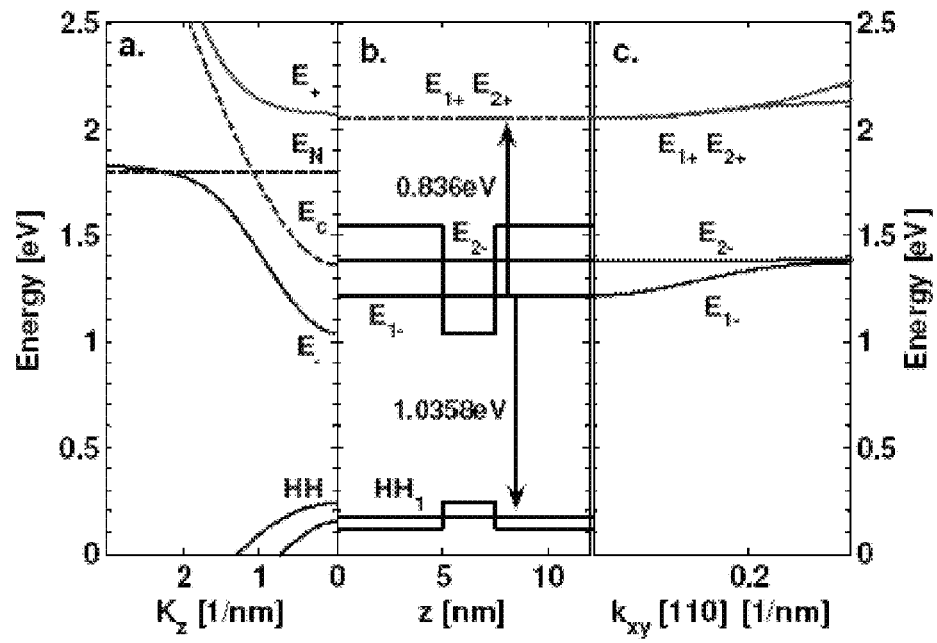
FIGS. 10A-C show ten band k·p calculations of the electronic energy levels and band dispersion curves of a light detection system fabricated according to some embodiments of the present invention.

FIG. 10A shows the results at room temperature of calculations for InGaAs bulk material that demonstrate the restructured $E_-$ and $E_+$ subbands resulting from the band anticrossing interaction between the $E_N$ and the extended states of the conduction band in a strained layer of GaIn$_{0.25}$AsN$_{0.02}$ on GaAs. FIG. 10B shows the energy levels of the first two bound levels in the conduction band of GaIn$_{0.25}$AsN$_{0.02}$/GaAs QW, $E_{1-}$ and $E_{2-}$, where $E_{2-}$−$E_{1-}$≈180 meV. GaInAsN $E_+$ level (FIG. 10A) becomes $E_{1+}$ and $E_{2+}$ resonant levels in the continuum of the heterostructure, where $E_{2+}$−$E_{1+}$≈4 meV only due to lack of confinement and is described by a single line in FIG. 9B. FIG. 10C shows the dispersion in the xy plane of the GaInAsN QW. A similar dispersion curve, taking into account differences in the structure's parameters, was experimentally observed by magnetotransport in a resonant tunneling diode [Patane, 2005, Phys. Rev. B71, 195307].

The room temperature calculated 1.0358 eV (1.197 μm shown in FIG. 10B) $E_{1-}$ to HH1 interband transition energy agrees well with the PL 1.03 eV experimental result shown in FIG. 8C). The PC peak at 1.42 μm (0.87 eV), shown in FIG. 9, is attributed to the intraband transition from the QW bound state $E_{1-}$ to the resonant state in the continuum $E_{2+}$. This transition energy, confirmed by the ten band k·p model (0.836 eV, 1.48 μm) shown in FIG. 10B is within experimental error from the measured ISB PC 0.87 eV energy presented in FIG. 9.

The high responsivity of the system of the present embodiments is attributed to the relatively long lifetime of the excited electrons in the $E_+$ localized resonant states. These localized states originate from the deep and long-range scattering potential induced by the nitrogen atoms.

In general, the spectral responsivity is given by $R_i$=(q/hv)$\eta g_{photo}$, where v is the photon frequency, $\eta$ is the absorption quantum efficiency, and $g_{photo}$ is the optical gain. Under standard approximation $g_{photo}$≈$\tau_c/t_{transit}$, where $t_{transit}$ is the total transit time across the active region. For $\eta$≈0.2 (absorption of 0.5% per well per pass), bias of 0.5 V, GaAs barrier mobility at room temperature of 3000 cm$^2$/V s, $\lambda$=1.4 μm, and measured responsivity of 2 A/W, the photoconductive gain and lifetime $\tau_c$ are estimated to be 8.85 and 15 ps, respectively. This value for $\tau_c$ is one order of magnitude larger than the typical value for a conventional GaAs/AlGaAs QWIP. The value of approximately 0.5% per well per pass is based on experimental result for a transition between two delocalized gamma levels and is taken here as an upper limit for absorption.

Additionally, FIG. 9A demonstrates that the peak photoresponse as a function of temperature decreases nearly exponentially as the temperature is raised from 150 to 300 K. This can be explained by thermal emission of electrons out of the GaInAsN QWs, which increases at elevated temperatures. An additional possible effect is the longer lifetime of excited electrons to $E_+$ localized states at low temperatures.

In conventional n-type QWIP made of III-V semiconductors, without N, the TE absorption or PC is typically much weaker than the TM absorption. Unlike conventional QWIP, the system of the present embodiments shows similar absorptions of TM and TE polarized light.

Example 2

Exemplified GaInAsN/AlGaAs Light Detection System

Light detection systems according to some embodiments of the present invention demonstrated the existence of bound states in the continuum. Two systems were fabricated. A first system was similar to the system described in Example 1, and a second system was a QWIP that included a structure of Te-doped GaInAsN/AlGaAs.

The produced photocurrent was assigned to transitions from a confined $E_-$ level in the quantum wells to a localized resonant $E_+$ level in the continuum. The experimental results of the PC spectroscopy were analyzed using both the band anticrossing (BAC) model and its extension to 10-band k·p model calculations. The analysis below relies on the unique nature of the $E_-$ and $E_+$ dispersion curves.

Samples were grown using the metal organic chemical vapor deposition (MOCVD) technique on semi-insulating (001)-oriented GaAs substrates, using trimethylgallium, trimethylindium, arsine, and dimethylhydrazine as the material sources, and dimethyltelluride as the N-type doping source. MQW GaInAsN/GaAs and GaInAsN/AlGaAs structures with 10 periods of Te-doped 25 Å $GaIn_{0.25}AsN_{0.02}$ QWs and 480 Å undoped GaAs or $Al_{0.26}GaAs$ barriers were grown as the active region of a QWIP.

The MQW structure was sandwiched between 5000 Å thick highly N-doped GaAs contact layers. The doped active GaInAsN QWs were grown at 500° C. The low growth temperature was selected to allow incorporation of 1%-2% N into $Ga_{0.75}In_{0.25}As$. The undoped GaAs and AlGaAs barrier layers were grown at 750° C. Standard photolithography and wet etching techniques were used to form 200× 200 μm² mesa structures. N-type ohmic contacts were formed using Ni—Ge—Au—Ni—Au alloy deposited onto the top and bottom contact layers and annealed at 400° C. HRXRD, low-temperature PL, time-of-flight (TOF) SIMS, and TEM were employed to characterize the quality of the MQW structures.

A 45° wedge was polished on the QWIP sample side to study the ISB PC. The samples were illuminated with infrared light orientated normal to the polished facet. The photocurrent was measured in the wedge configuration using am FTIR (Bruker-Equinox 55) with internal NIR and MIR sources. For the PC measurements, the detector was mounted in a closed cycle helium flow optical cryostat, and characterized at different applied bias voltages with a chopper frequency of f=135 Hz. All the measurements were conducted using a 1.18 μm high-pass filter to prevent any "parasitic" response related to the GaAs contact layers and interband photocurrent.

The temperature-dependent photoresponse spectra of the QWIP structures were obtained at different bias voltages. The dark current was measured using a standard semiconductor parameter analyzer (SPA) over the relevant operating voltage span at several temperatures. Transmission measurements were conducted in the front-illumination mode with respect to a reference GaAs substrate using a standard PerkinElmer UV-vis NIR spectrometer. The intraband photocurrent responsivity was measured using a calibrated 1.55 micron semiconductor laser in the zigzag waveguide configuration.

The modeling of the light detection system of the present example will now be described.

Figures 11A, 11B, 11C:
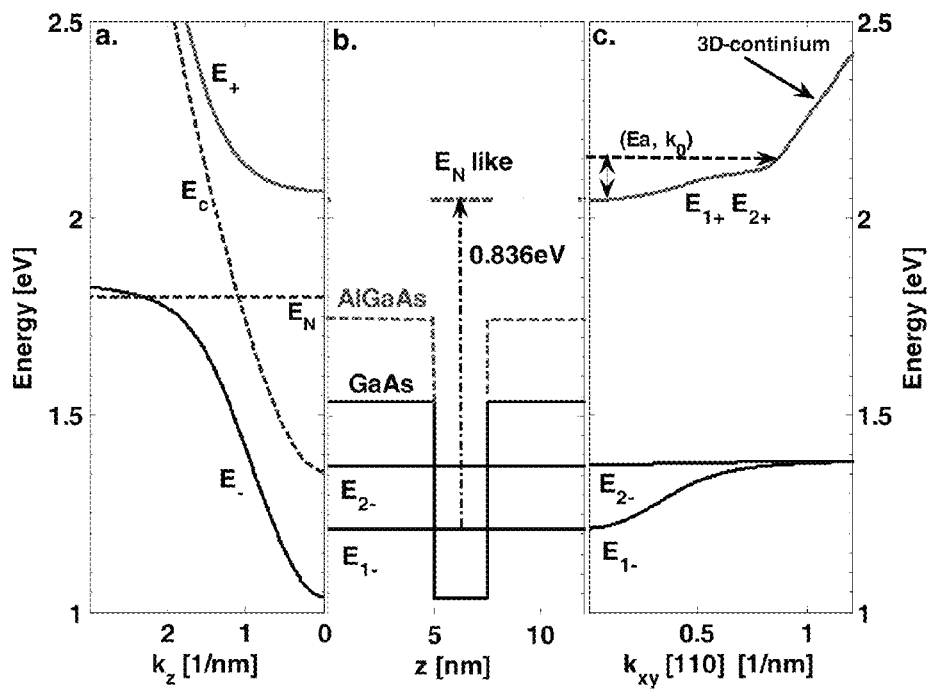
FIGS. 11A-C show additional ten band k·p calculations of the electronic energy levels and energy band dispersion curves of a light detection system fabricated according to some embodiments of the present invention.

The band structure, wave function, and intersubband transition energies of symmetric GaInAsN/GaAs QWs were calculated using a 10-band k·p model that describes the effect of localized nitrogen resonant level coupling to the extended conduction and valence band states. The model used, a finite difference procedure and took into account the strain. The binary compounds and the GaInAsN nitrogen parameters (the localized nitrogen-related energy level position, $E_N$, and the interaction strength of $E_N$ with the conduction band states, $V_{NC}$, and valence band states, $P_N$) were taken from the literature (see Example 1). The two samples had structures designed to have $E_N$ lying above the QW barrier edge so that it would anticross with the three-dimensional (3D) continuum above. FIG. 11A shows the results of calculations, in bulk InGaAs material, obtained at room temperature that demonstrate the restructured $E_-$ and $E_+$ subbands dispersion curves resulting from the band anticrossing interaction between the $E_N$ and the extended states of the conduction band in a strained layer of $GaIn_{0.25}AsN_{0.02}$ on GaAs.

Next, the energy levels in a QW with large confinement energy were calculated. FIG. 11B shows the energy levels of the first two bound levels in the conduction band of $GaIn_{0.25}AsN_{0.02}/GaAs$ QW, $E_{1-}$ and $E_{2-}$, where $E_{2-}-E_{1-}\approx180$ meV. The GaInAsN $E_+$ level (FIG. 11A) becomes the $E_{1+}$ and $E_{2+}$ resonant levels in the continuum of the heterostructure, where $E_{2+}-E_{1+}\approx4$ meV and is shown by the single line in FIG. 11B. The replacement of the GaAs barrier by AlGaAs has a very small effect on $E_{1-}$ and $E_{2-}$ and no effect on $E_{+1,2}$, since these levels in the continuum depend on the N content in the GaInAsN layer, which is the same in the two QWs.

FIG. 11C shows the dispersion in the xy plane of the GaInAsN/GaAs QW. The room temperature calculated value was 1.0358 eV for the $E_{1-}$ to $HH_1$ interband transition energy, which agrees well with the PL experimental data of 1.03 eV (see Example 1).

Figure 13A:
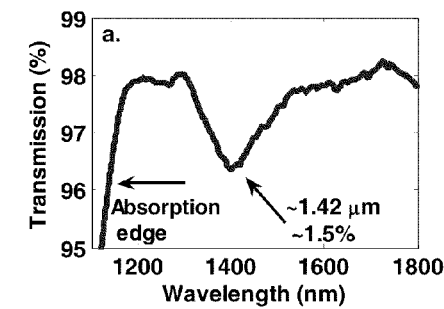
FIG. 13A shows front illumination transmission measurements of a light detection system fabricated according to some embodiments of the present invention.
Figure 13B:
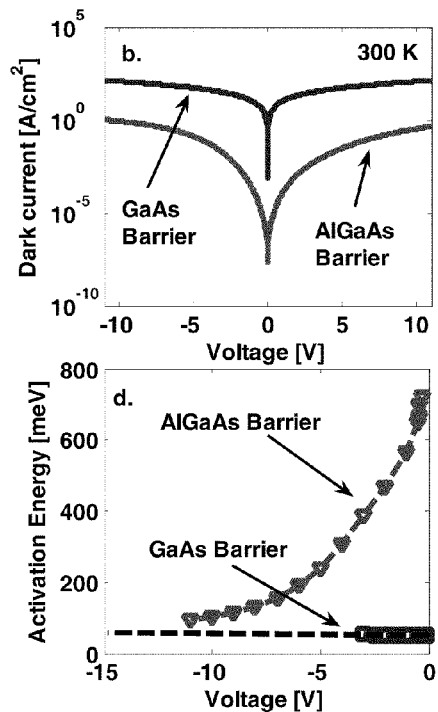
FIG. 13B shows the dark current as a function of the bias at room temperature as measured for the system of FIG. 13A.

The Photocurrent spectra of the two QWIP structures as a function of temperature from 150 K to 300 K are shown in FIGS. 12A and 12C. The transmission spectra from the front illumination of the GaInAsN/GaAs structure is shown in FIG. 13A, and the dark current at 300 K of the two QWIP structures is shown in FIG. 13B.

The photocurrent spectra, front illumination transmission spectra, and dark current characteristics in FIGS. 12 and 13 show several features, which will now be discussed.

The dominant PC signals of the two QWIP structures showed a maximum at a wavelength of about 1.42 μm (870 meV), indicating that the transition energy involved was independent of the barrier height, and was to an upper level that was higher than the barrier of both structures (about 500 meV and about 700 meV for the GaAs and AlGaAs barriers, respectively).

The two peaks were nearly polarization independent, as have been demonstrated in Example 1 above for a GaInAsN/GaAs QWIP. A clear GaInAsN absorption edge and inter-subband absorption deep at longer wavelengths of about 1.42 μm was shown in the front illumination transmission spectrum of the GaInAsN/GaAs MQW sample shown in FIG. 13A. This is an additional confirmation of the polarization-independent PC response demonstrated in Example 1. The PC measurements in the two QWIPs were taken at different bias voltages of 0.5 and 10 V for the GaAs and AlGaAs QWIPs, respectively. The different bias voltages were selected to allow reaching similar Fermi energy level in the two QWIPs, which had different carrier concentrations in the QWs. The activation energy of the dark current as a function of the bias, shown in FIGS. 13C and 13D, confirms that the AlGaAs barrier strongly reduced the dark current compared to GaAs barrier.

Due to the difference in barrier heights, the dark current for the GaInAsN/AlGaAs QWIP was four to six orders of magnitude lower than the dark current of the GaInAsN/GaAs QWIP, as shown in FIG. 13B.

An opposite experimental temperature dependence was observed for the two QWIP PC signals, as shown in FIGS. 12A and 12C. The PC signal for the GaInAsN/GaAs QWIP decreased with temperature, while the PC signal for the GaInAsN/AlGaAs QWIP increased with temperature. The activation energy of the PC signal extracted from the Arrhenius plots, shown in FIGS. 12B and 12D, was negative (−50 meV) for the GaInAsN/GaAs QWIP and positive (137 meV) for the GaInAsN/AlGaAs QWIP.

Figure 13C:
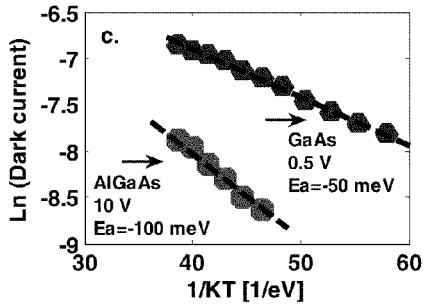
FIG. 13C shows the dark current as a function of $1/kT$ as measured for two light detection systems fabricated according to some embodiments.

The PC dependence on the bias (electric field) field was linear for the GaInAsN/GaAs QWIP structure (keeping the bias in the range where the Fermi energy was constant, as shown in FIG. 13C).

The relative PC width at half maximum, $\Delta\lambda/\lambda_{peak} \approx 14\%$, was narrow, indicating bound to quasi-bound transition characteristics, and the responsivity and gain were very high compared to standard QWIPs, as will be discussed further later on.

The PC peaks of the two QWIP structures occurring at wavelength of about 1.42 μm (FIGS. 12A and 12C), correspond to the intersubband transitions from the QWs bound state $E_{1-}$ to the resonant $E_+$ states in the continuum. These transition energies were confirmed, within the experimental error, by the 10-band k·p model (1.48 μm, 0.84 eV) shown in FIG. 11B. As expected, these transitions were not dependent on the barrier heights, since the position of their energy in relation to the N content in the GaInAsN QW was the same in both samples (neglecting the small effect of the barrier height on $E_{1-}$). This is further strengthened by the absorption deep occurring at about 1.42 μm in the transmission spectrum (FIG. 13A).

Figure 13D:
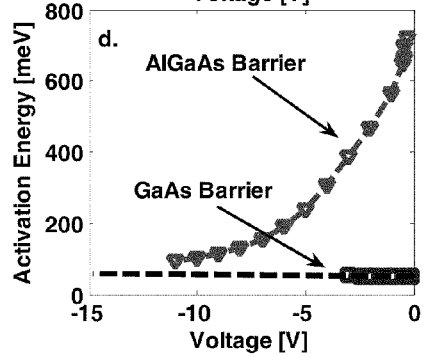
FIG. 13D shows the dependence of the activation energy on the bias voltage extracted from the dark current measurements shown in FIGS. 13B-C.

Taking into account the losses in the optical path, the size of the detector, and the coupling efficiency of the light, the present inventors found that the room-temperature peak current responsivity was about 18 A/W and 21 A/W for the GaInAsN/GaAs and GaInAsN/AlGaAs QWIPs, respectively. As is demonstrated below, the very high responsivity of the two QWIPs is related to the long lifetime of the excited states and the small emission probability to the 3D continuum. The reduction in the PC signal as a function of temperature in the GaInAsN/GaAs QWIP is ascribed to the thermal emission of free carriers out of the GaInAsN QWs. This is also confirmed by the nearly equal but opposite sign (±50 meV) of the activation energy of the decreased PC signal (FIG. 12B) and the increased dark current signal (FIG. 13D). The increased PC intensity as a function of temperature of the AlGaAs barrier QWIP can be explained by the dependence of the escape probability of excited electrons from the localized $E_+$ resonant level into the 3D continuum.

The dynamics of the excited carriers was studied using QWIP and LO phonon scattering theory. Standard QWIP theory was used for the extraction of the parameters that controlled the high responsivity of the QWIPs structures in this example.

Taking into account that the spectral responsivity, $R_i$, is 18 A/W and 21 A/W at λ=1.42 μm, and the measured η=0.015 (FIGS. 12A, 12C, and 13C), the gain was calculated to be $g_{photo}$=1048 and $g_{photo}$=1222 for the GaAs and AlGaAs QWIPs, respectively, assuming the same absorption for both structures. Under a typical approximation, $g_{photo}=p_e/Np_c$ and $p_c \approx \tau_c/t_{transit}$, where $p_e$ is the escape probability from an excited state, and is usually taken to be unity if the excited state is in the continuum above the well, N is the number of wells in the structure, $p_c$ is the capture probability into the well of the excited electron, $\tau_c$ is the capture time of the excited electron into the well, and $t_{transit}$ is the transit time across one quantum well region including the surrounding barriers. Since the barrier height of the AlGaAs QWIP is 200 meV higher than the GaAs barrier, the electron thermal escape probability (the dark current) from the QW was lower, and the dominant factor that influenced the exponential increase in the PC signal with temperature in this structure (FIGS. 12C and 12D) was related to the escape probability of electrons from the excited quasi-bound state, $E_+$, as will be discussed later.

The thermal escape of QW's confined electrons from the AlGaAs barrier QWIP was confirmed by the low dark current and the high activation energy of the dark current (FIGS. 13B and 13C). The excited electrons' escape probability, $p_e$, was extracted from the activation energy of the PC of the GaInAsN/AlGaAs QWIP ($E_a$=137 meV, FIG. 13D), using a simple statistical expression, $p_e$=exp(−$E_a$/kT)=5.14×10$^{-3}$ (using Boltzmann statistics). This calculation relied on the clear exponential dependence of the photocurrent (PC∝η×$g_{photo}$, assuming that η is independent of temperature), and neglected the T$^{3/2}$ weaker temperature dependence of the mobility was neglected. $p_c$ and $\tau_c$ were extracted from the relationship, $g_{photo} \approx p_e/Np_c$, yielding $p_c$=4.2×10$^{-7}$ and $\tau_c \approx t_{transit}/p_c$=59 ns (assuming a room temperature mobility of 1000 cm$^2$/V·s for the electrons above the AlGaAs barriers). Assuming that the values of $p_e$ and η are about the same for the GaAs and AlGaAs barrier structures, and using the procedure described above, the calculations yield $p_c$=4.9×10$^{-7}$ and $\tau_c$=120 ns at room temperature (using an RT mobility of 8500 cm$^2$/V·s for the electrons in the GaAs barrier) for the GaInAsN/GaAs QWIP.

The high values of the responsivity, gain, and excited carriers capture time are a few orders of magnitude larger than typical values for standard GaAs/AlGaAs QWIP structures. The present inventors discovered that the slowing down of the carrier relaxation time and the decrease in excited carrier emission probability is the result of the strongly modified band structure in GaInAsN and the N localized resonant nature of the $E_+$ level around k=0, forming a bound state in the continuum.

Example 3

Scattering Analysis

The scattering analysis was based on the unique dispersion nature of the $E_+$ level. From the band anticrossing model, the wave function $\psi_+$ can be described as a linear combination of the unperturbed 3D continuum, $\psi_{co}$, and the resonant N localized, $\psi_N$, wave functions, respectively.

$$\psi_+ = \alpha_c \psi_{co} + \alpha_N \psi_N,$$

where $\alpha_c^2 + \alpha_N^2 = 1$. The fractional N character, $f_N = \alpha_N^2$, of the $E_+$ state provides a useful measure of how much the N-related states perturb the conduction band wave functions. FIG. 11A shows the characteristic features of the conduction band dispersion calculated using the 10 bands k·p model for the GaInAsN structure studied in the present example. An examination of the $E_+$ dispersion curve shows that near to k=0 it has a near unperturbed localized $\psi_N$ nature ($\alpha_N^2 \approx 0.95$ at k=0, FIGS. 11A and 11C). As shown in FIG. 11C for k>k$_0$ (the anticrossing point), $E_+$ is tangential to the 3D continuum dispersion curve. Experimental evidence for the dilute nitrides dispersion curves was observed recently by Patane et al. supra using magnetotransport in resonant tunneling diode.

The following provides details of the numerical estimation of the electrons excited to the $E_+$ relaxation time, $\tau_c$, and the escape time, $\tau_e$. The dominant scattering mechanism between subbands separated by more than the optical phonon energy is the emission of the longitudinal optical phonons. To compute the relaxation time, $\tau_c$, induced by a LO phonon interaction potential of an electron in the localized level $E_+$ (k=0) transitions to a final state $\psi_f$, the Fermi golden rule expression was used [P. Harrison, "Quantum Wells, Wires and Dots, Theoretical and Computational Physics of Semiconductors and Nanostructure," 2nd Ed, Wiley, England, 2007 page 296].

$$\frac{1}{\tau_i} = \frac{\Gamma''}{2}\Theta\left(k_i^2 - \frac{2m^*\Delta}{\hbar^2}\right)\int_{-\infty}^{+\infty}\frac{\pi|G_{if}(K_z)|^2}{\sqrt{\left(k_i^2 - \frac{2m^*\Delta}{\hbar^2}\right)\frac{K_z^4 + 2K_z^2}{+\left(\frac{2m^*\Delta}{\hbar^2}\right)^2}}}dK_z, \quad (1)$$

where $$\Gamma'' = \frac{2m^*e^2wp'}{(2\pi)^2\hbar^2} = \frac{2m^*e^2w}{(2\pi)^2\hbar^2}\left(\frac{1}{\varepsilon_\infty} - \frac{1}{\varepsilon_s}\right)\left(N_0 + \frac{1}{2} \pm \frac{1}{2}\right), \quad (2)$$

m* is the effective electron mass, e is the electron charge, $\omega$ is the phonon frequency, and $\epsilon_\infty$ and $\epsilon_s$ are the high- and low-frequency permittivity of the material, respectively. The factor $$\left(N_0 + \frac{1}{2} \pm \frac{1}{2}\right)$$

represents the phonon density within the crystal. The upper signal preceded by the ± term represents the phonon emission and the lower phonon absorption. The term $$\Theta\left(k_i^2 - \frac{2m^*\Delta}{\hbar^2}\right)$$

is the Heaviside unit step function that ensures that there are only finite lifetimes, $\tau_i$, $\Delta = E_f - E_i \pm \hbar\omega$, where $E_i$ and $E_f$ are the initial and final subband edge states (assuming that $k_i=0$ for a BSIC at the $E_+$ subband), and $\hbar\omega$ is the LO phonon energy.

The form factor $G_{if}(K_z)$ is given by $$G_{if}(K_z) = \int \psi_f^*(z)e^{-iK_z z}\psi_i(z)dz, \quad (3)$$

where $\psi_i$ and $\psi_f$ are the electron wave functions of the final and initial envelope states. In the present example, the initial excited state, $\psi_i$, at $E_+$ (k=0) is different from the standard envelope function of an excited state in a QW. Taking into account the "nitrogen nature" of the dispersion curve of $E_+$ at k=0, a Gaussian-shaped wavefunction was used in the calculations (see EQ. 4, below) for the initial excited electron state, $\psi_i$ localized over a length b, describing an electron bound to a nitrogen center.

$$\psi_i = \psi_N = \left(\frac{2}{\pi b^2}\right)^{1/4}\exp\left(\frac{-(z-z_0)^2}{b^2}\right) \quad (4)$$

The localization length was taken to be b=6 Å. The final state, $\psi_f$, was taken to be the lowest-k 3D continuum state at the QW barrier edge normalized over a width, L.

$$\psi_f = \psi_{continuum} = \sqrt{\frac{2}{L}}\sin(K_z z) \quad (5)$$

In the following calculation, the normalization length L=1000 Å was equal to two QWIP periods. The relaxation time from the barrier edge to the bound state $E_{1-}$, which is in the picosecond range and is much faster than the relaxation time calculated below, was neglected.

Figure 14A:
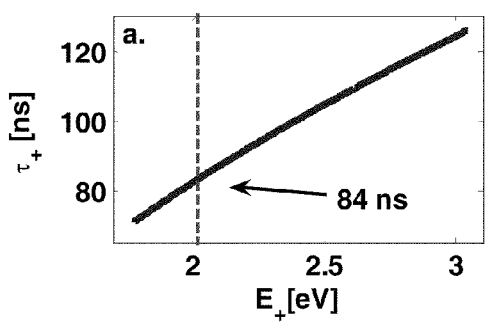
FIGS. 14A-B show scattering rate via LO phonon emission as a function of the position of the energy above an AlGaAs barrier, as calculated according to some embodiments of the present invention.

For the effective electron mass m*, the value 0.055 $m_0$ was selected ($m_0$ being the electron mass) to describe the GaInAs unperturbed 3D continuum dispersion curve assuming a parabolic approximation. The relatively high- and low-frequency permittivity was taken to be the GaAs values of 10.98 and 13.18, respectively, and the energy of the optical phonon was taken to be $\hbar\omega_{LO}=36$ meV. The result of the phonon emission scattering time calculations for the electron relaxation time, $\tau_c$, as a function of the position of the $E_+$ energy at k=0 above the AlGaAs barrier is shown in FIG. 14A. For the relevant position of $E_+$ in the present example ($E_+=2.044$ eV), the calculation resulted in $\tau_c=84$ ns for the GaInAsN/AlGaAs QWIP, which is of the same order of magnitude as the relaxation time extracted from the experiment results above $\tau_c=59$ ns.

The same procedure was used to evaluate the escape time, $\tau_{escape}$, of the localized electron from the excited state $E_+$ (k=0) into the free state, $\psi_f$, in the 3D continuum with a higher k value around the anticrossing point, $k_0$, calculated using EQ. 6, below.

$$E_{C\,min}^{AlGaAs} + \frac{\hbar^2}{2m^*}k^2 = E_+(k=0) \quad (6)$$

Figure 14B:
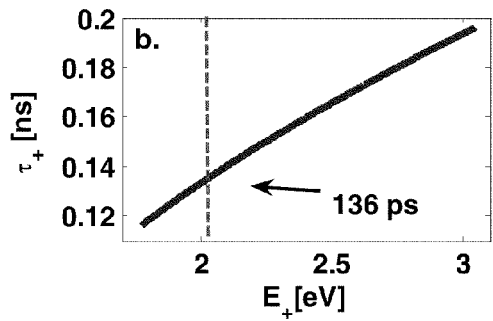

The dependence of the electron escape time on the $E_+$ energy is shown in FIG. 14B. For $E_+=2.044$ eV, the calculated escape time (to the $k_0$ state) is $\tau_{escape}=136$ ps. When the approximate value of the escape time was calculated using the "attempt frequency" approach, $$\tau_{escape} = \frac{h}{kT}\exp\left(\frac{E_a}{kT}\right)$$

and the experimental escape probability, $p_e=\exp(-E_a/kT)=5.14\times10^{-3}$, the obtained value was $\tau_{escape}=30$ ps for the excited electron escape time into the continuum. This value is slightly faster than the calculated value, 136 ps. The dependence of the scattering equation (EQ. 1) on the phonon density explains the exponential increase in PC with temperature for the GaInAsN/AlGaAs QWIP. The PC activation energy of the GaInAsN/AlGaAs QWIP is explained by the difference in energy between the bound state at $E_+$ (k=0) to the 3D continuum state at k>$k_0$ (FIG. 11C).

The matrix element for coupling between the bound state at $E_+$ (k=0) to the 3D continuum was also calculated. The bound state wave function, $\psi_N$, was taken as 3D Gaussian localized over a length, b, describing an electron bound to nitrogen center. The 3D continuum wave function was built from cosine functions along the x-, y-, and z-directions normalized over a length, L (for each direction separately). Wave function continuity conditions were assumed along the growth direction at the well/barrier interface $z=z_a$. The probability for an electron in the bound state to be coupled to the continuum is given by:

$$|\langle \Psi_{BS}^N | \delta(z-z_a) | \Psi_{3d-continium} \rangle|^2 \leq \left(6.3 \sqrt{\frac{b}{L}} \cdot \frac{1}{L}\right)^2. \quad (7)$$

As specified in EQ. 7, the probability is bounded by a dimensional relationship.

Taking the normalization factor for the 3D continuum wave function as the length of two QWIP periods, $L_x=L_y=L_z=1000$ Å, and the electron localization length b of a bound state at $E_+$ (k=0) to be 6 Å, results in a coupling probability of about $2 \times 10^{-6}$. This small value for the coupling probability demonstrates the inefficient tunneling process from the localized electron at $E_+$ (k=0) to the 3D continuum compared to the relatively faster LO phonon scattering process to the high k continuum states, as calculated above, and shown in FIG. 11B. The measured PC dependence on the bias shows that the applied electric field does not affect the emission probability, and the linear relationship of PC on the electric field is attributed exclusively to the barrier electron transition time, $t_{transit}$, field dependence. This result confirms the calculated small coupling value between the localized state at $E_+$ and the 3D continuum, and demonstrates the dominant effect of phonon scattering on the emission probability, as reflected by the increase in PC signal as a function of temperature for the GaInAsN/AlGaAs QWIP.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A light detection system, comprising:
    an active region between a back contact layer and a front contact layer, said active region comprising a quantum well structure having a quantum well between quantum barriers, said quantum barriers being defined by an energy height above which there is a continuum of electronic states;
    wherein said quantum well comprises foreign atoms inducing an excited bound state at an energy level which is above said energy height of said quantum barriers;
    wherein said foreign atoms are other than atoms that form a semiconductor compound forming said quantum well, and other than donor atoms of a doping agent that is inserted into said semiconductor compound.

2. The system of claim 1, wherein said active region comprising a plurality of similar quantum well structures.

3. The system of claim 1, wherein said foreign atom comprises nitrogen.

4. The system of claim 1, wherein said foreign atom comprises bismuth.

5. The system of claim 1, wherein said foreign atoms induce a fundamental bound state at an energy level which is below said energy level characterizing said quantum barriers, and wherein an energy difference between said excited bound state and said fundamental bound state is equivalent to a photon wavelength of from about 1 micron to about 10 microns.

6. The system of claim 1, wherein a thickness of said quantum well is less than 3 nanometers.

7. The system of claim 6, wherein said foreign atoms induce a fundamental bound state at an energy level which is below said energy level characterizing said quantum barriers, and wherein an energy difference between said excited bound state and said fundamental bound state is equivalent to a photon wavelength of from about 1 micron to about 10 microns.

8. The system of claim 1, wherein a thickness of said quantum well is from about 2 nanometers to about 3 nanometers.

9. The system of claim 8, wherein said quantum well comprises indium at a concentration of from about 20% to about 30%, and wherein said foreign atoms are nitrogen atoms at a concentration of from about 2% to about 4%.

10. The system of claim 9, wherein said quantum barriers comprise aluminum at a concentration of from about 25% to about 30%.

11. The system of claim 9, wherein said quantum barriers comprise aluminum at a concentration of less than 15%.

12. The system of claim 8, wherein said quantum well comprises indium at a concentration of from about 15% to about 25%, wherein said foreign atoms are nitrogen atoms at a concentration of from about 1% to about 2%, and wherein said quantum barriers are devoid of aluminum or comprise aluminum at a concentration of less than 1%.

13. The system of claim 8, wherein said quantum well is devoid of indium or comprises indium at a concentration of less than 1%, wherein said foreign atoms are nitrogen atoms at a concentration of from about 0.1% to about 0.5%, and wherein said quantum barriers are devoid of aluminum or comprise aluminum at a concentration of less than 1%.

14. The system of claim 1, wherein said quantum well is a GaInAs quantum well, said foreign atoms are nitrogen atoms and said quantum barriers are selected from the group consisting of AlGaAs quantum barriers and GaAs barriers.

15. The system of claim 1, wherein said quantum well is a GaAs quantum well, said foreign atoms are nitrogen atoms, and said quantum barriers are selected from the group consisting of GaAs quantum barriers and AlGaAs quantum barriers.

16. The system of claim 15, wherein a thickness of said quantum well is less than 8 nanometers.

17. The system of claim 1, wherein said quantum well is an InGaAs quantum well, said foreign atoms are nitrogen atoms and said quantum barriers are InP quantum barriers.

18. The system of claim 1, wherein said quantum well is a GaInAs quantum well, said foreign atoms are nitrogen atoms and said quantum barriers are AlInAs quantum barriers.

19. The system of claim 1, wherein said quantum well is an InP quantum well, said foreign atoms are nitrogen atoms and said quantum barriers are AlInAs quantum barriers.

20. An imaging system, comprising the light detection system according to claim 1.

21. An optical communications system, comprising the light detection system according to claim 1.

22. The system of claim 1, wherein said foreign atoms are at a concentration of at least 1% and less than 5%.

23. A method of detecting light, comprising causing the light to impinge on an optically active region of a light detection system, and measuring a change of electrical current generated by said system thereby detecting the light;
   wherein said active region comprises a quantum well structure having a quantum well between quantum barriers, said quantum barrier being defined by an energy height above which there is a continuum of electronic states, and wherein said quantum well comprises foreign atoms effecting an excited bound state at an energy level which is above said energy height of said quantum barriers;
   wherein said foreign atoms are other than atoms that form a semiconductor compound forming said quantum well, and other than donor atoms of a doping agent that is inserted into said semiconductor compound.

24. The method according to claim 23, wherein the light is an infrared light.

25. The method according to claim 23, wherein the light is other than a linearly polarized light while impinging on said optically active region.

26. A method of designing an optically active region of a light detection system, comprising:
   selecting an energy level of a fundamental bound state;
   selecting an energy difference between an excited bound state and said fundamental bound state;
   using a data processor for calculating a thickness of a quantum well based on said energy level;
   using a data processor for calculating a concentration of foreign atoms in said quantum well based on said energy difference; and
   designing quantum barriers defined by an energy height above which there is a continuum of electronic states, wherein said energy height is below an energy level of said excited bound state.

27. The method of claim 26, wherein said foreign atoms comprise nitrogen atoms.

28. A light detection system, comprising:
   an active region between a back contact layer and a front contact layer, said active region comprising a quantum well structure having a quantum well between quantum barriers, said quantum barriers being defined by an energy height above which there is a continuum of electronic states; and
   a measuring device generating a light detection event signal indicative of electrical potential difference generated between said contact layers in response to light absorbed by said quantum well;
   wherein said quantum well comprises foreign atoms inducing an excited bound state at an energy level which is above said energy height of said quantum barriers;
   wherein said foreign atoms are selected from the group consisting of nitrogen and bismuth;
   wherein said quantum well is selected from the group consisting of a GaAsR, quantum well, an InGaAsR quantum well, and an InPR quantum well, said R representing said foreign atoms; and
   wherein when said quantum well is a GaAsR quantum well, said quantum barriers are selected from the group consisting of GaAs quantum barriers and AlGaAs quantum barriers, when said quantum well is a InGaAsR quantum well, said quantum barriers are selected from the group consisting of InP quantum barriers, AlInAs quantum barriers, AlGaAs quantum barriers and GaAs quantum barriers, and when said quantum well is a InPR quantum well, said quantum barriers are AlInAs quantum barriers.

* * * * *